(12) United States Patent
Raben

(10) Patent No.: US 7,312,106 B2
(45) Date of Patent: Dec. 25, 2007

(54) METHOD FOR ENCAPSULATING A CHIP HAVING A SENSITIVE SURFACE

(75) Inventor: Jurgen Raben, Terborg (NL)

(73) Assignee: Elmos Advanced Packaging B.V., Nijmegen (NL)

( * ) Notice: Subject to any disclaimer, the term of this patent is extended or adjusted under 35 U.S.C. 154(b) by 183 days.

(21) Appl. No.: 10/472,907

(22) PCT Filed: Mar. 26, 2002

(86) PCT No.: PCT/NL02/00192

§ 371 (c)(1),
(2), (4) Date: Apr. 21, 2004

(87) PCT Pub. No.: WO02/078077

PCT Pub. Date: Oct. 3, 2002

(65) Prior Publication Data
US 2004/0171195 A1 Sep. 2, 2004

(30) Foreign Application Priority Data
Mar. 26, 2001 (EP) .................................. 01201122

(51) Int. Cl.
*H01L 21/56* (2006.01)
(52) U.S. Cl. ................... 438/112; 438/116; 438/124; 438/126; 438/127; 257/787; 257/E23.116; 257/E21.504
(58) Field of Classification Search ................ 438/106, 438/107, 111, 112, 124, 125, 126, 127, 105, 438/116; 257/787, 789, E21.504, E23.116
See application file for complete search history.

(56) References Cited

U.S. PATENT DOCUMENTS 4,697,203 A * 9/1987 Sakai et al. ................. 257/681
4,894,707 A 1/1990 Yamawaki et al.

(Continued)

FOREIGN PATENT DOCUMENTS

EP 0 499 758 8/1992

(Continued)

OTHER PUBLICATIONS

Patent Abstracts of Japan, vol. 1998, No. 03, Feb. 27, 1998 -& JP 09 304211 A (Omron Corp), Nov. 28, 1997 the whole document.

(Continued)

Primary Examiner—M. Wilczewski
(74) Attorney, Agent, or Firm—Young & Thompson

(57) ABSTRACT

Method for encapsulating a chip having a sensitive surface exposed in a sealed highly clean cavity package, includes bonding a chip's contact pads to lead frame contact pads, positioning the chip and lead frame into one part of a two part mould, taking measures to keep the space above the sensitive surface of the chip free during the encapsulation process, closing the mould with a second mould part, introducing the package material into the closed mould and providing the circumstances to let the package cure. The method also including applying a closed dam of heat resistant material around the sensitive chip area and placing a lid on the dam such that space above the sensitive area enclosed by the dam and the lid is sealed.

10 Claims, 1 Drawing Sheet

U.S. PATENT DOCUMENTS

| | | | |
|---|---|---|---|
| 5,072,284 A * | 12/1991 | Tamura et al. | 257/680 |
| 5,106,784 A * | 4/1992 | Bednarz | 29/827 |
| 5,258,576 A * | 11/1993 | Neumann et al. | 174/50.5 |
| 5,343,076 A * | 8/1994 | Katayama et al. | 257/717 |
| 5,534,725 A * | 7/1996 | Hur | 257/434 |
| 5,577,319 A * | 11/1996 | Knecht | 29/827 |
| 5,773,323 A * | 6/1998 | Hur | 438/123 |
| 5,786,631 A * | 7/1998 | Fishley et al. | 257/701 |
| 5,861,680 A * | 1/1999 | Yamanaka | 257/793 |
| 5,950,074 A * | 9/1999 | Glenn et al. | 438/121 |
| 5,989,941 A * | 11/1999 | Wensel | 438/127 |
| 6,492,699 B1 * | 12/2002 | Glenn et al. | 257/433 |
| 6,531,341 B1 * | 3/2003 | Peterson et al. | 438/123 |
| 6,661,084 B1 * | 12/2003 | Peterson et al. | 257/680 |
| 6,674,159 B1 * | 1/2004 | Peterson et al. | 257/680 |
| 6,696,752 B2 * | 2/2004 | Su et al. | 257/678 |
| 6,884,663 B2 * | 4/2005 | Dlugokecki et al. | 438/126 |
| 6,906,403 B2 * | 6/2005 | Bolken et al. | 257/678 |
| 6,972,497 B2 * | 12/2005 | Prior | 257/788 |

FOREIGN PATENT DOCUMENTS

NL        1 003 315        12/1997

OTHER PUBLICATIONS

Patent Abstracts of Japan, vol. 010, No. 035 (E-380), Feb. 12, 1986 -& JP 60 193345 A (Matsushita Denshi Kogyo KK), Oct. 1, 1985 the whole document.

* cited by examiner

METHOD FOR ENCAPSULATING A CHIP HAVING A SENSITIVE SURFACE

BACKGROUND OF THE INVENTION

The invention relates to a method for encapsulating a chip having a sensitive surface exposed in a sealed highly clean cavity package, comprising the following steps:
a) mounting the chip onto a lead frame (instead of a lead frame also a substrate or tape or other material on which a conductive interconnection pattern is applied can be used),
b) bonding the chip contact pads to the lead frame contact pads
c) positioning the chip and lead frame into the one part of a two part mould
d) taking measures to keep the space above the sensitive surface of the chip free during the encapsulation process,
e) closing the mould by placing the second part thereof on top of the above-mentioned one part,
f) introducing the package material into the mould and providing the circumstances to let the package cure in the desired manner.

DESCRIPTION OF THE RELATED ART

Such a method is known from the older patent publication NL1003315 in the name of applicant. In this prior art publication the measures mentioned in step d) above comprise:
applying an amount of deformable heat resistant material on an inward projecting section which during the encapsulation process is in contact with the sensitive chip surface such that during the introduction of the package material in the closed mould said sensitive surface can not be reached by the package material. After demoulding the deformable heat resistant material is removed and the resulting package is completed by applying the glass window and fastening said window using a suitable adhesive. As an alternative the deformable material can be applied to the surface of the semiconductor circuit.

A disadvantage of the above mentioned method is that the sealing of the sensitive chip surface takes place only just after completing a number of assembly steps. One of these steps is the encapsulation process. The chance the chip surface becomes contaminated is, although small, not inconceivable. Besides this physical contact with the chip surface takes place during the encapsulation process.

A disadvantage of the above mentioned alternative method is the fact that the actual encapsulation process results into a semiproduct being a package with an open cavity filled with said deformable heat resistant material. In general the deformable heat resistant material will be removed from the cavity at a location different from the location where the encapsulation process took place. After removing of said material the window has to be installed and adhered which may take place at a third different location. The chance that the cavity becomes contaminated is, although small, not inconceivable.

SUMMARY OF THE INVENTION

The object of the invention is now to provide a method whereby the whole process including encapsulation and including the installation of the lid will take place in one logical series of steps which can be carried out in a continuous manner in a highly clean environment.

In agreement with said object the invention now provides a method for encapsulating a chip having a sensitive surface exposed in a sealed highly clean cavity package, comprising the following steps:
a) mounting the chip onto a lead frame,
b) bonding the chip contact pads to the lead frame contact pads
c) positioning the chip and lead frame into the one part of a two part mould
d) taking measures to keep the space above the sensitive surface of the chip free during the encapsulation process,
e) closing the mould by placing the second part thereof on top of the above-mentioned one part,
f) introducing the package material into the mould and providing the circumstances to let the package cure in the desired manner, characterized in that the above mentioned measures in step d) comprise:
d1) applying a closed dam of heat resistant material around the sensitive chip area,
d2) placing a lid on said dam such that the space above the sensitive area enclosed by said dam and said lid is sealed. The lid material can be glass, plastic etc. which can be transparent, semi-transparent (applying an IR filter for example) or even non-transparent if desired (functioning as a membrane for pressure applications for example).

The result of this method is a sealed cavity package which is manufactured in a clean room condition in one continuous series of steps whereby the lid is present already at the earliest stage during assembly in other words, the sensitive chip surface is sealed off by an enclosed dam and lid, done under very clean circumstances.

A preferred embodiment of the method according to the invention has the characteristic that in the ready situation the top surface of said lid is positioned underneath the level of the upper surface of the package, for which during the encapsulation process measures are taken to maintain the upper lid surface free from the upper surface of the mould. The advantage of this preferred embodiment is that the package material may enclose the complete edge of the lid so that in fact the lid is not only kept in place by the adherence of the dam material but is also kept in place by the enclosing package material.

According to a preferred method the level difference between the upper surface of the mould and the upper surface of the lid is obtained in that the mould has an inward projecting section which during the encapsulation process is in contact with the upper surface of the lid. It is specially preferred thereby that a layer or element of resilient material is applied in between the glass lid and the inwards projecting section.

In any case it is preferred that the dimensions of the dam are selected such that the bonding wires will be encapsulated either by the package material or by the dam material. Depending of the dam material properties it is possible to achieve a package of which the sealed cavity is nearly moisture insensitive. This might be of importance for the functionality of the system.

BRIEF DESCRIPTION OF THE DRAWINGS

The invention will now be explained in more detail with reference to the attached drawings, whereby.

DESCRIPTION OF THE PREFERRED EMBODIMENT

Figure 1A:
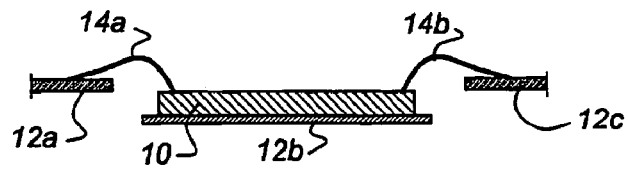
FIGS. 1a, 1b, and 1c illustrate various steps in the encapsulating process resulting into a packaged chip of which the lid is positioned in a recess.

FIG. 1a illustrates the first step in the method according to the invention. The actual chip 10 is positioned on and attached to a lead frame 12 which in the illustrated embodiment consists of separate sections 12a, 12b en 12c. By means of suitable apparatuses the bonding wires between the contact pads on the lead frame 12 and the contact pads on the chip 10 are brought into place. Two of the bonding wires are referenced by 14a and 14b in FIG. 1a.

Figure 1B:
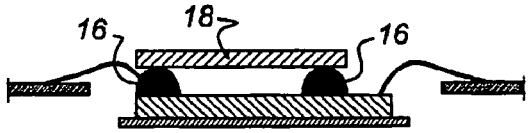

The next step is illustrated in FIG. 1b. On top of the chip 10 a dam is formed from a heat resistant somewhat deformable material. This dam 16 has an angular, rectangular or other shape, that is in any way closed. By means of a suitable apparatus a lid 18 is installed on the upper part of the dam 16, such that the space bounded by the lid 18, the dam 16 and the chip 10 is sealed off in a clean room environment. The lid 18 adheres to the dam 16. Dependent on the material properties of the dam 16 the lid 18 is fixed in place just by the adherent property of the material of the dam 16. If the stiffness of the darn 16 is sufficient to maintain the lid 18 in place then no further measures are necessary. However, if the stiffness of the dam 16 is not sufficient then it is preferred that measures are taken to cure the dam 16 while the lid 18 is maintained in place using for instance heat, ultraviolet light, or other suitable influences.

It is remarked that the bonding wires may be completely or partly embedded in the dam material, such as bonding wire 14a, or may left free such as wire 14b.

Now the obtained semi product is ready for encapsulation. This encapsulation can be made of a thermoharder or thermoplast material. For that purpose the product is located in the lower half of a suitable mould which is thereafter closed by the other half of said mould. After closing the mould the inner cavity is filled up with the fluid packaging material whereby the enclosed cavity between lid 18, dam 16 and the chip 10 is maintained free of packaging material.

It is supposed that measures have been taken to keep the upper surface of the lid 18 free of packaging material 20. To obtain this desired result the upper half of the mould could have an inward extending section, whereby it is preferred that a layer or element of resilient material is applied, which during the actual encapsulation process is in contact with the upper surface of the lid 18. Examples of moulds having an inwards extending section suitable for this purposes are described in NL-1003315.

Another solution for obtaining a free upper surface of the lid 18 is the use of a drop of thick fluid heat resistant material such as a drop of silicon gel or another suitable material which is brought on to the upper surface of the lid 18 and after closing of the mould takes care that no encapsulation material can reach the upper surface of the lid. A similar procedure for maintaining the upper surface of a light sensitive semi conductor free of encapsulation material is described in the European Patent EP-0682374.

Figure 2:
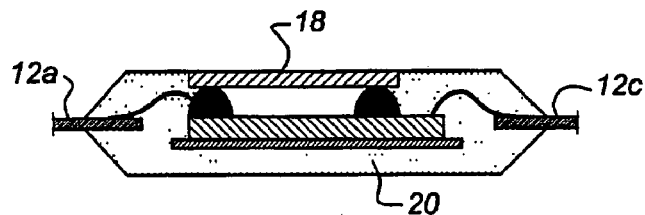
FIG. 2 illustrates another example of a package according to the invention whereby the upper surface of the lid is flat with the upper service of the package.

FIG. 2 illustrates another example of a package which may result from the method according to the invention. In this example the upper surface of the lid 18 is flat with the upper surface of the package. It will be clear that in this case the dimensions of the dam 16 as well as the dimensions of the lid 18 are selected such that after closing the mould, which has no inserting section, the upper surface of the glass lid is pressed against the upper inner surface of the mould. This inner surface can be provided with a layer or element of resilient material. Therewith introduction of packaging material 20 onto the top service of the lid is prevented.

Figure 3:
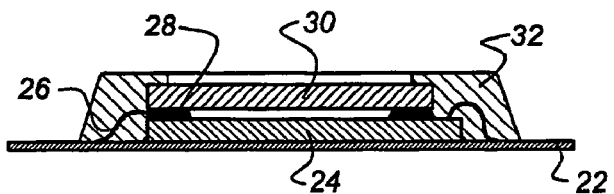
FIG. 3 illustrates another example of a package which may result from the method according to the invention.

FIG. 3 illustrates another example of a package which may result from the method according to the invention. In this example a substrate or tape or other material, on which a conductive interconnection pattern is applied, is used instead of a lead frame. More in detail FIG. 3 shows the substrate 23 onto which the chip 24 is mounted. Furthermore one of the bonding wires is indicated by 26. The dam 28 carries the lid 30 and the whole combination is encapsulated by the packaging material 3, such that the upper surface of the lid 30 is maintained free.

Figure 1C:
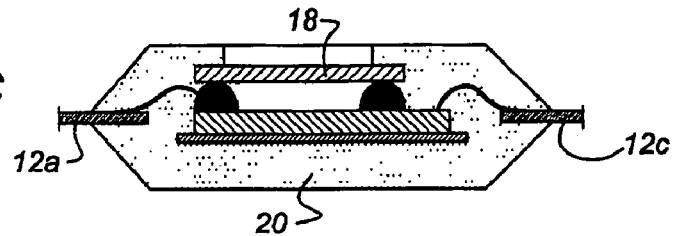
Figure 4A:
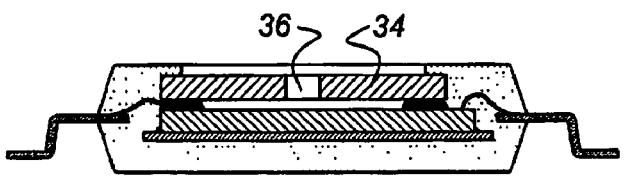
FIG. 4a illustrates still another example of a package which may result from the method according to the invention, with an opening 36 in the lid 34.

FIG. 4 shows another example of a package which may result from the method according to the invention. Contact with the outer world other than light as for example pressure or flow applications is possible because the lid 34 is provided with an opening 36. Advantage of this method is that any contact of the sensitive chip area during assembly is avoided and wires are encapsulated. Because the only difference between FIG. 4a and FIG. 1c is the opening 36 in the lid 34 all other components of this embodiment are not indicated by separate reference numbers.

Figure 4B:
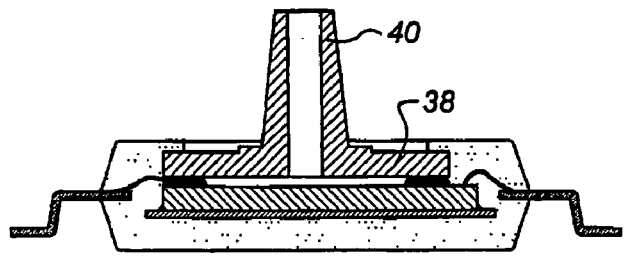
FIG. 4b illustrates yet another example of a package which may result from the method according to the invention, with a lid 38 provided with a connection tube 40.

FIG. 4b shows a package attached with a lid 38 provided with a connection tube 40. All other details of this embodiment are again equal to the corresponding details in FIG. 1c and are therefore not referenced by separate numbers.

The invention claimed is:

1. A method for encapsulating a chip having a sensitive surface exposed in a sealed highly clean cavity package, comprising the sequential steps of:
    A) mounting a chip having a sensitive chip surface and contact pads on a carrier having carrier contact pads;
    B) bonding the chip contact pads to the carrier contact pads;
    C) applying a closed dam around the sensitive chip surface, the applying of the closed dam defining an open space inside the dam;
    D) positioning a lid closing the open space inside the dam;
    E) positioning the chip and the carrier into a first part of a two part mould;
    F) closing the mould by placing a second part of the two part mould on a top of the first part; and
    G) introducing package material into the closed mould and providing circumstances to let the package cure in a desired manner to produce a formed package.

2. Method according to claim 1, comprising the further step of keeping an upper surface of the lid free from an upper surface of the mould so that in the formed package, the top surface of said lid is positioned underneath an uppermost level of an upper surface of the formed package.

3. Method according to claim 2, characterized in that, the mould has an inward projecting section which during the encapsulation process is in contact with the upper surface of the lid.

4. Method according to claim 3, characterized in that a layer or element of resilient material is applied in between the lid and the inwards projecting section.

5. Method according to claim 2, comprising the further step of applying a resilient material between a surface of the upper mould section and the upper surface of the lid.

6. Method according to claim 1, characterized in that the carrier is embodied as a lead frame, a substrate, tape or other material comprising a conductive interconnection pattern.

7. Method according to claim 6, comprising the further step of bonding chip contact pads to contact pads of said conductive interconnection pattern.

8. Method according to claim 1, wherein, dimensions of the dam are selected such that bonding wires will be encapsulated either by the package material or by the dam.

9. Method according to claim 1, characterized in that the lid has an opening providing direct access to an inner cavity surrounded by the chip, the dam, and an inner lid surface.

10. A method for encapsulating a chip having a sensitive surface exposed in a sealed highly clean cavity package, comprising the sequential steps of:
- A) bonding chip contact pads, of a chip having a sensitive chip surface, to carrier contact pads of a carrier;
- B) applying a closed dam around the sensitive chip surface to define an open space inside the dam;
- C) positioning a lid to close the open space inside the dam;
- D) positioning the chip and the carrier into a first part of a two part. mould;
- E) closing the mould by placing a second part of the two part mould on a top of the first part; and
- F) introducing package material into the closed mould to form a sealed highly clean cavity package.

* * * * *